(12) United States Patent
Schmauder et al.

(10) Patent No.: US 10,767,261 B2
(45) Date of Patent: Sep. 8, 2020

(54) DEVICE AND METHOD FOR VACUUM COATING

(75) Inventors: Torsten Schmauder, Egelsbach (DE); Gunter Kern, Bruchkobel (DE)

(73) Assignee: Leybold Optics GmbH, Alzenau (DE)

( * ) Notice: Subject to any disclaimer, the term of this patent is extended or adjusted under 35 U.S.C. 154(b) by 526 days.

(21) Appl. No.: 13/811,222

(22) PCT Filed: Jul. 22, 2011

(86) PCT No.: PCT/EP2011/003679
§ 371 (c)(1),
(2), (4) Date: Jul. 3, 2013

(87) PCT Pub. No.: WO2012/010318
PCT Pub. Date: Jan. 26, 2012

(65) Prior Publication Data
US 2013/0316096 A1 Nov. 28, 2013

(30) Foreign Application Priority Data

Jul. 23, 2010 (DE) .......................... 10 2010 032 152
Jul. 28, 2010 (DE) .......................... 10 2010 032 591

(51) Int. Cl.
*C23C 16/448* (2006.01)
*C23C 16/50* (2006.01)
*C23C 14/50* (2006.01)

(52) U.S. Cl.
CPC ............ *C23C 16/448* (2013.01); *C23C 14/50* (2013.01); *C23C 16/50* (2013.01)

(58) Field of Classification Search
CPC ... C23C 16/4485; C23C 16/50; C23C 16/503; C23C 16/505; C23C 16/507; C23C 16/509
See application file for complete search history.

(56) References Cited

U.S. PATENT DOCUMENTS 4,986,212 A * 1/1991 Shibamoto ............. C23C 14/26
 118/715
5,380,420 A * 1/1995 Tsuji ........................ 204/298.41
(Continued)

FOREIGN PATENT DOCUMENTS

DE   3731688 A1   3/1989
DE   4010663 A1   10/1991
(Continued)

OTHER PUBLICATIONS

Takimoto et al., JP 2008-240105; Oct. 9, 2008. (Machine translation).*
(Continued)

*Primary Examiner* — Parviz Hassanzadeh
*Assistant Examiner* — Nathan K Ford
(74) *Attorney, Agent, or Firm* — Mintz Levin Cohn Ferris Glovsky and Popeo, P.C.; Michael A. Mattoni

(57) ABSTRACT

The invention relates to a device for vacuum coating substrates in a vacuum chamber, comprising an elongated evaporator array having a plurality of evaporator elements arranged along a longitudinal axis and a first substrate carrier unit which is associated with the evaporator array and has a first pylon that can be rotated about a first axis and contains retaining means for substrates, wherein an angular offset of less than 10° is present between the longitudinal axis and the first rotational axis. The device is characterised in that at least one second substrate carrier unit is provided, which is associated with the evaporator array and has a second pylon that can be rotated about a second axis and contains retaining means for substrates, wherein an angular offset of less than 10° is present between the longitudinal axis and the second rotational axis. At least one second substrate carrier unit (22, 122, 222) which is associated with the evaporator array (10, 110, 110*a*) and has a second pylon (Continued)

Figure 1:
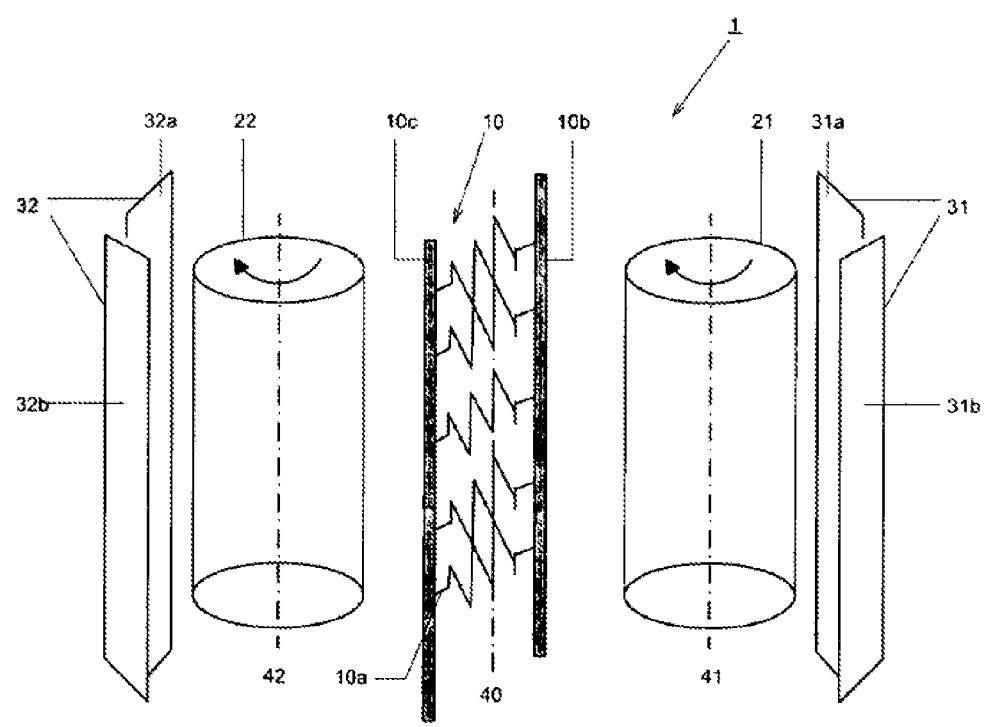

that can be rotated about a second rotational axis (42, 242) and contains retaining means for substrates is provided, wherein the axes of the pylons are designed to be fixed relative to the longitudinal axis (40) of the evaporator array, an angular offset of less than 10° is present between the longitudinal axis (40) and second rotational axis (42, 242), and a geometric configuration of the evaporator array (10, 110, 110*a*) and of the first (21, 121, 221) and the at least second substrate carrier units (22, 122, 222) is provided such that substrates of the first (21, 121, 221) and the at least second substrate carrier units (22, 122, 222) can be coated with the same quality by means of the evaporator array (10). The invention further relates to a method for vacuum coating by means of the device.

17 Claims, 4 Drawing Sheets

(56) References Cited

U.S. PATENT DOCUMENTS

| | | | | |
|---|---|---|---|---|
| 5,730,847 | A | * | 3/1998 | Hanaguri et al. ........ 204/298.41 |
| 6,045,667 | A | | 4/2000 | Moll |
| 2003/0085123 | A1 | | 5/2003 | Shi et al. |
| 2004/0074445 | A1 | * | 4/2004 | Fujii .................... C23C 14/541 |
| | | | | 118/723 VE |
| 2005/0005860 | A1 | * | 1/2005 | Shimojima ........... C23C 14/505 |
| | | | | 118/728 |
| 2011/0117289 | A1 | | 5/2011 | Hayashi et al. |
| 2011/0305833 | A1 | | 12/2011 | Fiedler |

FOREIGN PATENT DOCUMENTS

| | | |
|---|---|---|
| EP | 1947211 A1 | 7/2008 |
| GB | 1317052 A | 5/1973 |
| GB | 1321486 A | 6/1973 |
| JP | 01-263266 | 10/1989 |
| JP | 01-048072 | 11/1990 |
| JP | 09031659 A | 2/1997 |
| JP | 2002-212709 A | 7/2002 |
| JP | 2004-156139 A | 6/2004 |
| JP | 2008240105 A | 10/2008 |
| JP | 2009228062 A | 10/2009 |
| WO | 2008067969 A1 | 6/2008 |
| WO | WO-2009084408 A1 | 7/2009 |

OTHER PUBLICATIONS

The Translation of the Notification of Reasons for Refusal (type I office Action), dated Feb. 26, 2014, dated Mar. 3, 2014, JP. Pat. Appl. No. 2013-521007.
Internation Search Report (Translation) of International Application No. PCT/EP2011/003679, dated Nov. 17, 2011.
International Preliminary Report on Patentability of International Application No. PCT/EP2011/003679, dated Jan. 31, 2013.

* cited by examiner

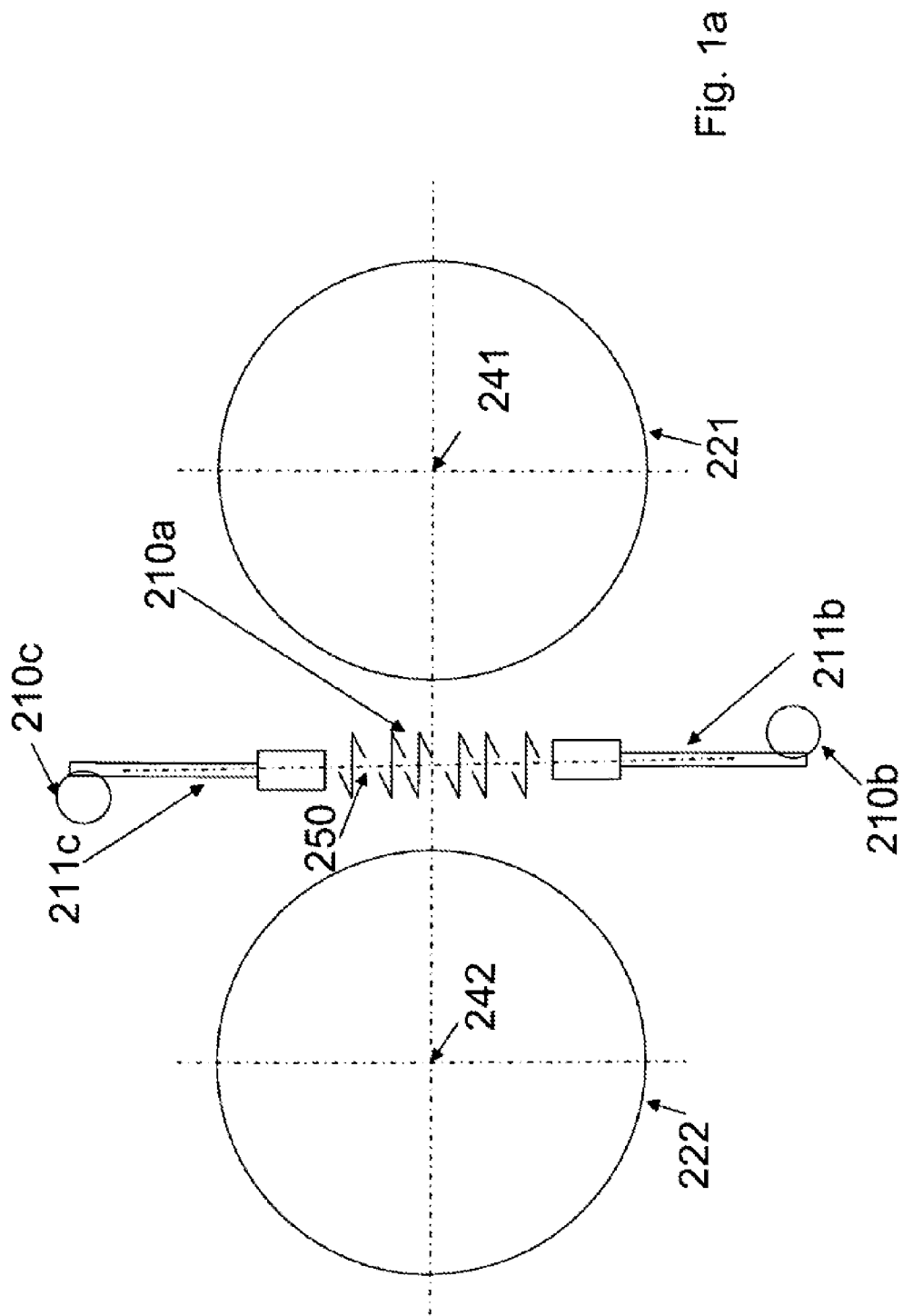

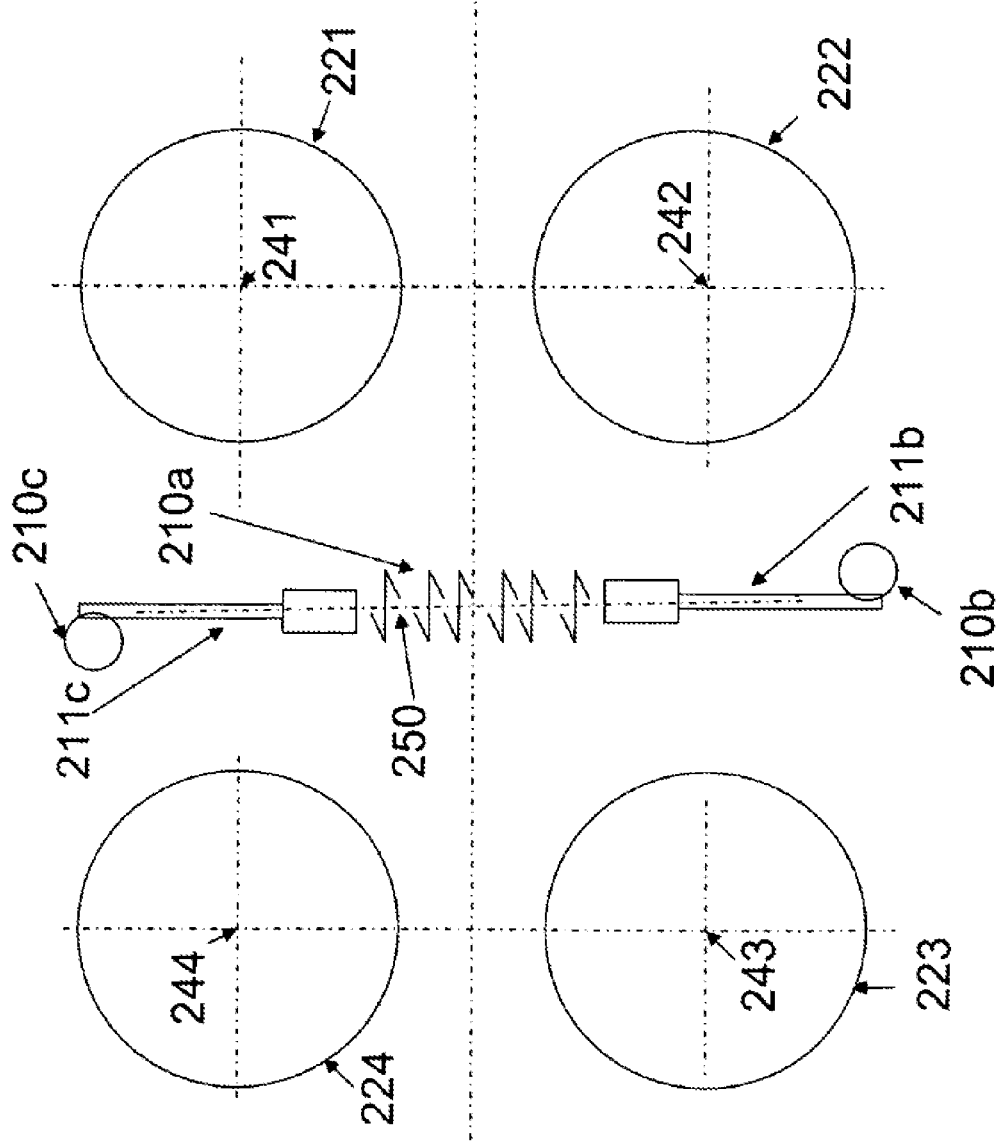

DEVICE AND METHOD FOR VACUUM COATING

CROSS-REFERENCES TO RELATED APPLICATIONS

This application is a 35 U.S.C. § 371 national stage entry of PCT/EP2011/003679, which has an international filing date of Jul. 22, 2011 and claims priority to German Patent Application No. 102010032152.4, filed on Jul. 23, 2010 and German Patent Application No. 102010032591.0, filed on Jul. 28, 2010. The contents of each of the above applications are hereby incorporated herein in their entireties by reference.

The invention relates to a device and to a method, respectively according to the precharacterizing clauses of the independent patent claims.

Systems for the vacuum coating of substrates in batch operation are known. For example, DE 37 31 688 A1 or EP 947 211 A1 respectively describe a device for the metallization of substrates, having a vacuum chamber in which at least one evaporator source and—respectively configured differently in the two documents—devices for applying plasma-polymerized protective layers and a number of planetary substrate holders, rotating about a central axis, are arranged. With these known systems, only a relatively long cycle time in the range of more than 10 minutes can be achieved owing to the high spatial requirement of the substrate holders.

Batch systems having a significantly shorter cycle time are likewise known—about 4-5 minutes in sputtering systems of the PylonMet type of the Applicant. A disadvantage in this case is the very great technical outlay for equipping them with sputter sources.

It is an object of the invention to provide a device and a method with which, with low outlay, metallic layers can be applied onto substrates with high quality, short cycle time and high productivity.

The object is achieved by the feature of the independent patent claims. Advantageous embodiments may be found in the dependent claims.

The device according to the invention for the vacuum coating of substrates in a vacuum chamber, comprising an elongate evaporator array having a number of thermal evaporator elements arranged along a vertical longitudinal axis and a first substrate carrier unit which is associated with the evaporator array and has a first pylon that can be rotated about a first axis and has holding means for substrates, wherein there is an angular offset of less than 10° between the longitudinal axis and the first rotation axis, is distinguished in that at least a second substrate carrier unit is provided, which is associated with the evaporator array and has a second pylon that can be rotated about a second axis and has holding means for substrates, wherein the rotation axes of the pylons are stationary relative to the longitudinal axis of the evaporator array and a geometrical configuration of the evaporator array and of the first and the at least second substrate carrier unit is provided such that coating can be carried out by means of the evaporator array on substrates of the first and of the at least second substrate carrier unit with equal quality. The expression "vertical" relates to the vacuum chamber as a reference system. The term "quality" relates to parameters of the properties of the coating, in particular a layer thickness, a reflection factor and/or a color impression. The spatial orientation of the evaporator elements relative to the rotation axes of the pylons is static. The evaporator array does not rotate about its longitudinal axis; likewise, the substrate carrier units do not rotate about the evaporator array. If there is respectively an angular offset of less than 10° between the longitudinal axis and the evaporator array and the rotation axes, a similar geometrical configuration of the device can be achieved in a straightforward way so that the coating of the substrates by means of the evaporator array is carried out with the same or at least similar quality. The first and at least second substrate carrier units are to this end arranged at geometrically equivalent positions relative to the evaporator array, taking into account the spatial emission characteristics of the individual evaporator elements and of the evaporator array as a whole. The emission characteristic of an evaporator element is in this case intended to mean the angular dependency of the flow density of the evaporated material of one evaporator installed in the evaporator array.

The device according to the invention for the vacuum coating of substrates allows particularly compact configuration of the system and utilization of the coating vapor produced by means of the evaporator array, since the at least two substrate carrier units have pylons with fixed axes. The invention also covers the case of more than two pylons. If there is respectively an angular offset of less than 10° between the longitudinal axis and the evaporator array and the rotation axes, a similar geometrical configuration of the device can be achieved in a straightforward way so that the coating of the substrates which has been carried out by means of the evaporator array is carried out with the same or at least similar quality. In particular, the vacuum chamber, evaporator array and associated substrate carrier units are configured in such a way that a short cycle time in a range of between four and eight minutes is achieved. In particular, the substrates are three-dimensional substrates, for example for applications in the automotive sector, computer and communication electronics or consumer electronics, in particular made of plastic material, but also of a metallic material or glass, which are sometimes also ordered in relatively small batches.

With the invention, a high productivity of the coating process can be achieved despite relatively small batches, i.e. workpieces to be coated simultaneously.

Another embodiment of the invention is distinguished in that the evaporator array comprises at least one evaporator element having a horizontal longitudinal extent and a mirror-symmetrical emission characteristic with respect to a plane spanned by the longitudinal extent and the longitudinal axis, the expression "horizontal" relating to the vacuum chamber as a reference system. This can be achieved most simply with an evaporator element, for example a metal filament or a metal coil, clamped between evaporator holders. A first evaporator holder holds the evaporator element in the region of one end side; a second evaporator holder holds the evaporator element in the region of the second end side. The fastening of the first and second end sides respectively to the first holder and the second holder are geometrically similar, so that the emission characteristic is symmetrical with respect to an axis which extends through the longitudinal extent of the evaporator element.

It is to be understood that a multiplicity of evaporator elements usually have the aforementioned mirror-symmetrical emission characteristic. In the case of a first and a second substrate carrier unit, the evaporator elements are advantageously arranged between the substrate carrier units lying opposite one another. In the case of four substrate carrier units, they are advantageously arranged in the configuration of a square.

Another embodiment of the invention is distinguished in that at least one treatment source is provided, which is associated with the first or optionally further substrate carrier units. If the treatment source contains an evaporator array, the productivity of the device can be increased in respect of the vacuum coating by means of thermal evaporation. If the treatment source is a source other than an evaporator array, hybrid vacuum coating of the substrates can be carried out in a straightforward way.

In particular, the evaporator elements are arranged along a vertical longitudinal axis and a plasma source associated with the first substrate carrier unit is provided, which is arranged in such a way that the plasma treatment is directed on to the first substrate carrier unit. Furthermore, it is possible that on the side of the evaporator array facing away from the first substrate carrier unit a second substrate carrier unit, comprising a second pylon that can be rotated about a second axis and has holding means for substrates, and a second plasma source, which is associated with the second substrate carrier unit and is arranged in such a way that the second substrate carrier unit is treated by the second plasma source in a manner equivalent to that in which the first substrate carrier unit is treated by the first plasma source.

Another embodiment of the invention is distinguished in that the vacuum chamber comprises a first sub-chamber having an opening in the wall of the vacuum chamber, a second sub-chamber which is associated with the first sub-chamber in the manner of a door and by which the opening can be closed in a vacuum-tight fashion, in which case the evaporator array, the first and the at least second substrate carrier unit and optionally preferably at least components of the treatment source or treatment sources can be or are accommodated in the second sub-chamber. The second sub-chamber can be positioned relative to the first sub-chamber, so that the evaporator array and the first and at least second substrate carrier units are readily accessible and therefore the handling, in particular the equipping of the evaporator elements with evaporator material and the provision of substrates to the substrate carrier units, is facilitated. Expediently, the second sub-chamber can be positioned relative to the first sub-chamber by means of a swivel unit or by means of a displacement unit, so that adaptation to spatial conditions of the installation of the vacuum coating device according to the invention is possible.

Another embodiment of the invention is distinguished in that the vacuum chamber comprises a further sub-chamber, which is formed in a similar fashion to the second sub-chamber and is associated with the first sub-chamber in the manner of a door, and by which the opening of the first sub-chamber can be closed in a vacuum-tight fashion, so that alternating operation of the device with the second sub-chamber and the further sub-chamber is possible. During alternating operation, one of the sub-chambers is respectively positioned in such a way that the opening is closed in a vacuum-tight manner, while the respective other sub-chamber is positioned in such a manner that the evaporator array accommodated in it and the substrate carrier units are accessible. By means of the sub-chamber which closes the opening of the first sub-chamber in a vacuum-tight fashion, vacuum coating of substrates can be carried out in the vacuum chamber, while the other sub-chamber is positioned in an open fashion and, for example, is available for handling of the vapor array and substrate carrier unit.

The method according to the invention for the vacuum coating of substrates is distinguished in that the vacuum coating is carried out by means of a device according to the invention.

One embodiment of the method according to the invention is distinguished in that thermal evaporation of a metallic material, in particular of a material consisting of at least one of the members of the group consisting of aluminum, copper, tin, zinc, chromium, titanium, tantalum, silver, gold, rhodium, palladium and nickel, is carried out by means of the evaporator array, so that cost-efficient metallizations, in particular of three-dimensional substrates, can be carried out.

Another embodiment of the invention is distinguished in that it treatment of the substrates with the aid of a glow discharge, with which in particular pretreatment of the substrates before the coating can be carried out, is carried out by means of at least one of the treatment sources.

Another embodiment of the invention is distinguished in that treatment of the substrates with the aid of a plasma CVD process is carried out by means of the treatment source, particularly in order to apply a topcoat layer onto metallized substrate surfaces.

The invention will be described in more detail below with the aid of exemplary embodiments and references, from which further aspects and advantages of the invention may also be found independently of the summary in the patent claims.

Figure 2:
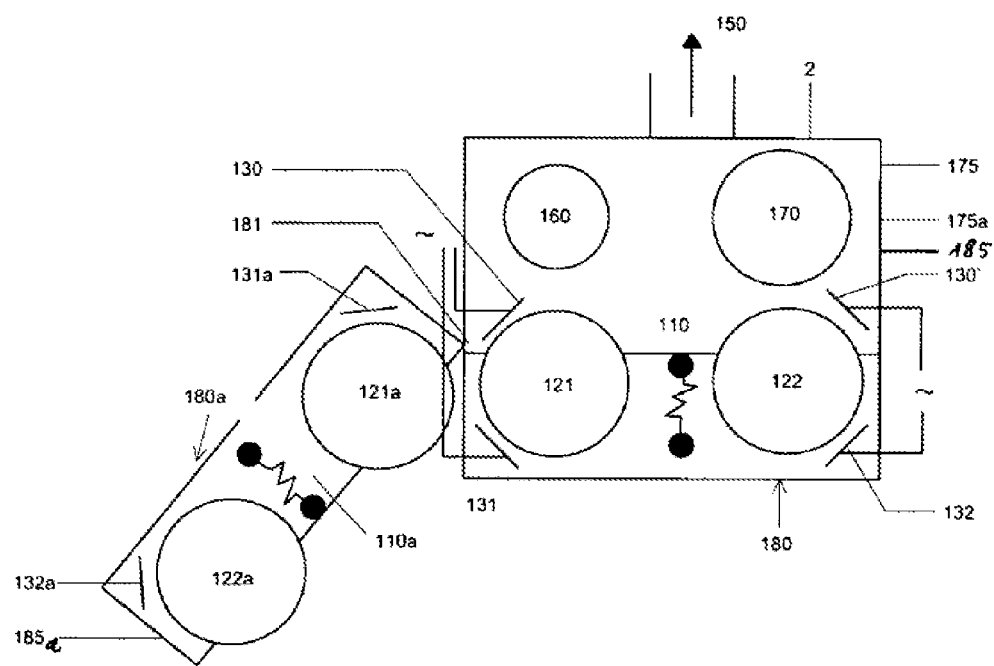

In schematic representations:

FIG. 1 shows a representation of the device according to the invention for the vacuum coating of abstracts, having an evaporator array, two substrate carrier units and two plasma sources FIG. 1a shows a representation of the device according to the invention for the vacuum coating of substrates, having an evaporator array and two substrate carrier units with an evaporator coil clamped into a holding clamp FIG. 1b shows a representation of the device according to the invention for the vacuum coating of substrates, having an evaporator array and four substrate carrier units with an evaporator coil clamped into a holding clamp FIG. 2 shows a sectional representation of a device according to the invention having a first sub-chamber and two further sub-chambers associated with the first sub-chamber in the manner of a door.

FIG. 1 represents a simplified representation of a device 1 for the vacuum coating of substrates in a vacuum chamber, preferably three-dimensional substrates, for example for applications in the automotive sector, computers, communication electronics or consumer electronics or the like. The substrates preferably consist of a plastic material, although other materials may also be envisioned. Besides the components which are not represented, in particular connections for pumps and delivery units for process gases, the device 1 comprises an elongate evaporator array 10 having a number of evaporator elements 10a which are arranged along a longitudinal axis 40 and which are arranged for example in a harp-shape in a frame-like construction with elongate carrier elements 10b, 10c. The evaporator elements 10a may for example be arranged over a length of from 150 cm to 200 cm length, in which case a distance of between 20 and 30 cm may for example be provided between the carrier elements 10b, 10c. The evaporator elements 10a may for example be configured for thermal evaporation, in particular as metal filaments or a metal coil having a horizontal symmetry axis, suitably clamped between the carrier elements 10b, 10c. Filling the evaporator elements with aluminum wire is preferred. Upon heating, for example as a result of an electric current being passed through, the metal evaporates so that metal vapors emerge from the region of the evaporator array, diffuse into the surrounding space and are deposited on the workpieces.

The device 1 furthermore comprises a first substrate carrier unit 21, which can be rotated about a drivable rotation axis 41 and is formed as a pylon, that is to say as a columnar framework structure. In FIG. 1, for simplification, no further details of the substrate carrier unit 21 and no substrates accommodated by the unit 21 are represented. The rotation axis 41 is preferably aligned parallel to the longitudinal axis 40, in the context of which it should be understood that an alignment of the rotation axis 41 and the longitudinal axis 40 with a small angular offset, for example less than 10°, is also covered by the invention.

The device 1 furthermore comprises a second substrate carrier unit 22 having a rotation axis 42, which is formed in a similar way to the substrate carrier unit 21. The rotation axis 42, in a similar way to the rotation axis 41, is also aligned parallel to the longitudinal axis 40 or with a small angular offset of less than 10 degrees. The rotation axes 41, 42 are fixed relative to the longitudinal axis 40.

It is to be understood that the invention also covers devices having more than two substrate carrier units, each with a pylon having holding means for substrates, there being an angular offset of less than 10° between the longitudinal axis of the evaporator array and the rotation axes of the pylons.

The invention also covers substrate carrier units which comprise planetary holding means for substrates, which are rotatable about rotation axes different to the rotation axis about which the pylon is rotatable.

The device 1 furthermore comprises treatment sources, formed as plasma sources 31, 32, for substrates. The plasma sources 31, 32 comprise means for exciting a plasma discharge in a region in which the substrate carrier units 21, 22 are arranged, in order to permit plasma treatment of the substrates. The treatment sources, in particular plasma sources, may be formed for pretreatment of the substrate surfaces and/or for plasma coating, in particular by means of plasma CVD. In particular, an inlet for reaction gases may furthermore be provided.

In the embodiment represented in FIG. 1, the plasma source 31 comprises an electrode 31a, a back electrode 31b and a grounded vacuum container (not represented) for generating a plasma, in particular a glow discharge for treating a surface to be treated on one or more substrates. The electrodes 31a, 31b are configured in the form of plates with an elongate geometry essentially parallel to the rotation axis 41. FIG. 1 furthermore shows a similar electrode 32a and back electrode 32b of the plasma source 32 associated with the substrate holding unit 22. The plasma sources 31, are preferably operated with an AC voltage, in particular a frequency between 1 Hz and 350 MHz, particularly preferably 40 kHz.

It is to be understood that the invention also covers further embodiments, and a different number of treatment sources, and in particular plasma sources configured in order to carry out a plasma CVD process with which for example a topcoat can be applied onto a metal layer. It is furthermore to be understood that the invention also covers separate plasma sources dedicated to particular treatments of the substrates. Furthermore, one of the treatment sources may also be provided for more than one treatment process, for example glow discharge and PECVD.

The dimensioning of the evaporator array 10 and of the treatment sources 31, 32 in the direction of the rotation axes 41, 42 is adapted in order to compensate for spatial end effects, i.e. in the present case by a certain extension of the evaporator array 10 or treatment source 31, 32 beyond the end regions of the substrate carrier unit 21, 22. Furthermore, a decrease e.g. in a coating rate in the end regions of the evaporator array 10 or the substrate carrier units 21, 22 may be compensated for by corresponding adjustment of the distance of the evaporator elements 10a from one another along the longitudinal axis 40. It is, however, also possible to provide other measures to compensate for spatial end effects, for example masks in a central region between the end regions.

FIG. 1a shows a simplified representation of a sectional view of an embodiment of the invention having an evaporator array and two substrate carrier units 221, 222, which are arranged mirror-symmetrically with respect to a longitudinal extent 250 of an evaporator element 210a and which respectively rotate about their longitudinal axes 241, 242. The evaporator array consists of two carrier elements 210b, 210c on which at least one evaporator holder 211b, 211c, which holds the evaporator element 210a, is respectively applied. The horizontal longitudinal extent 250 of the evaporator element 210a corresponds to the horizontal longitudinal extent of the evaporator array 10.

FIG. 1b shows a simplified representation of a sectional view of an embodiment of the invention having four substrate carrier units 221, 222, 223, 224 which are arranged mirror-symmetrically with respect to a longitudinal extent 250 of an evaporator element 210a, and point-symmetrically with respect to the center of the evaporator element 210a, and which respectively rotate about their longitudinal axes 241, 242, 243, 244.

FIG. 2 shows a sectional representation of another embodiment of the invention, having a device 2 which contains a vacuum chamber 175, which comprises a first sub-chamber 175a, a second sub-chamber 180 and a further sub chamber 180a. The first sub-chamber 175a has an opening in the wall 185, which can be closed in a vacuum-tight fashion by the second sub-chamber 180. The second sub-chamber 180 can likewise close the opening in a vacuum-tight fashion. The second sub-chamber 180 and the further sub-chamber 180a are formed in the manner of a door. By means of a swivel unit, the second sub-chamber 180 and the further sub-chamber 180a can be positioned relative to the first sub-chamber 175a. For the further sub-chamber 180a, a swivel axis 181 is represented in FIG. 2, about which the further sub-chamber 180a can be swiveled in order to open the opening. A corresponding swivel axis is provided for the second sub-chamber 180. It is to be understood that the second sub-chamber 180 and the further sub-chamber 180a can be opened and closed alternately, and that the corresponding door hinges are oriented opposite to one another.

The second sub-chamber 180 comprises an evaporator array 110 and substrate carrier units 121, 122, in a similar way as represented in FIG. 1. The second sub-chamber 180 furthermore comprises electrodes 131, 132, which are respectively associated with the substrate holder unit 121 and 122 and can be swiveled together with the second sub-chamber 180. A further electrode 130 and 130', respectively, is arranged in the first sub-chamber 175a, so that the electrodes 130, 131 and 130,132 respectively form an electrode pair. In the closed state, the electrodes 130, 131 and 130, 132 make it possible to form a plasma, with which treatment of substrates arranged in the substrate holders 121, 122 can be carried out.

FIG. 2 furthermore shows a swiveled further sub-chamber 180a, which comprises substrate carrier units 121a, 122a and electrodes 131a, 132a. Between the substrate carriers 121a, 122a, an evaporator array 110a is arranged in the further sub-chamber 180a. The further sub-chamber 180a can be swiveled about the swivel axis 181, in order to close the opening in the wall 185 of the first sub-chamber 175a, in the context of which it should be understood that the second sub-chamber 180 has previously been correspondingly positioned in order to uncover the opening in the wall 185. In the closed state, with the further sub-chamber 180a swiveled, a continuous, in particular vacuum-tight wall can be formed by the wall 185a and the wall 185.

By the division of the treatment sources 31, 32 into two parts, the servicing time between the coating processes can be shortened significantly since the doors can respectively be opened and closed in a single working step and all components which may need to be serviced or replaced (carrier elements 10a, 10b, 10c, substrates) are arranged in the doors.

Furthermore, a connection 150 for a process pump for processes with gas application is provided, which is preferably arranged symmetrically with respect to the substrate carrier unit 121, 122 in order to ensure the same vacuum conditions in the regions of the substrate carrier units 121, 122. It is to be understood that non-symmetrical arrangements of the connection 150 are also covered by the invention.

In the region of the first sub-chamber 175a, the device 2 has connections for at least one high-vacuum pump, in particular a diffusion pump, preferably an oil diffusion pump, as well as a device for removing water vapor, preferably a water pumping cooling trap. It is to be understood that the first sub-chamber 175a comprises further control means (not represented in detail) in addition to the components 160, 170.

LIST OF REFERENCES 1 device
2 device
10 evaporator array
10a evaporator element
10b carrier element
10c carrier element
21 substrate carrier unit
22 substrate carrier unit
31 treatment source
31a electrode
31b back electrode
32 treatment source
32a electrode
32b back electrode
40 longitudinal axis
41 longitudinal axis of a substrate carrier unit
42 longitudinal axis of a substrate carrier unit
110 evaporator array
110a evaporator array
121 substrate holder unit
121a substrate holder unit
122 substrate holder unit
122a substrate holder unit
130 electrode
130' electrode
131 back electrode
131a back electrode
132 back electrode
132a back electrode
150 connection
160 control means
170 control means
175 vacuum chamber
175a first sub-chamber
180 second sub-chamber
180a further sub-chamber
181 swivel axis
185 wall
185a wall
210a evaporator element
210b carrier element
210c carrier element
211a evaporator holder
211b evaporator holder
221 substrate carrier unit
222 substrate carrier unit
223 substrate carrier unit
224 substrate carrier unit
241 longitudinal axis of a substrate carrier unit
242 longitudinal axis of a substrate carrier unit
243 longitudinal axis of a substrate carrier unit
244 longitudinal axis of a substrate carrier unit
250 horizontal longitudinal extent

The invention claimed is:

1. A device for the vacuum coating of substrates in a vacuum chamber, comprising:
an elongate evaporator array having a number of metallic evaporator elements extending between carrier rods, wherein the evaporator elements are arranged along a vertical longitudinal axis with respect to one another and are configured to generate a vapor of a coating material;
a plurality of substrate carrier units associated with the evaporator array, comprising:
a first substrate carrier unit having a first columnar framework structure that can be rotated about a first rotation axis, wherein there is an angular offset of less than 10° between the longitudinal axis and the first rotation axis; and
a second substrate carrier unit having a second columnar framework structure that can be rotated about a second rotation axis, wherein there is an angular offset of less than 10° between the longitudinal axis and the second rotation axis,
wherein, when the first substrate carrier unit rotates about the first rotation axis and the second substrate carrier unit rotates about the second rotation axis, the axes of the columnar framework structures are stationary relative to the longitudinal axis of the evaporator array and the evaporator array generates the vapor of the coating material,
wherein the evaporator array does not rotate about its longitudinal axis,
wherein the first substrate carrier unit and the second substrate carrier unit do not rotate about the evaporator array,
wherein each of the plurality of substrate carrier units is arranged at geometrically equivalent positions relative to the evaporator array that take into account the spatial emissions characteristics of the individual evaporator elements and of the evaporator array as a whole such that coating can be carried out by the evaporator array on substrates with equal quality; and
wherein the spatial emission characteristic of an evaporator element is an angular dependence of a flow density of evaporated material of that evaporator element, and wherein the angle between the evaporator array and each substrate carrier unit is equivalent.

2. The device as claimed in claim 1, wherein the evaporator elements have a horizontal longitudinal extent and a mirror-symmetrical emission characteristic with respect to a plane spanned by the horizontal longitudinal extent and the longitudinal axis.

3. The device as claimed in claim 1, further comprising at least one treatment source associated with the first substrate carrier unit or the second substrate carrier unit.

4. The device of claim 3, wherein the at least one treatment source is formed as a plasma source having at least one electrode pair.

5. The device as claimed in claim 3, wherein the vacuum chamber comprises:
a first sub-chamber having an opening in the wall of the vacuum chamber,
at least one second sub-chamber associated with the first sub-chamber, wherein the at least one second sub-chamber can be positioned to close the first sub-chamber in a vacuum-tight fashion, wherein the evaporator array, the first substrate carrier unit, and the second substrate carrier unit, and the at least one treatment source are accommodated in the at least one second sub-chamber.

6. The device as claimed in claim 5, wherein the second sub-chamber can be positioned relative to the first sub-chamber by swiveling the second sub-chamber about a swivel axis.

7. The device as claimed in claim 5, wherein the vacuum chamber comprises a further sub-chamber associated with the first sub-chamber, wherein the further sub-chamber can be positioned to close the first sub-chamber in a vacuum-tight fashion.

8. The device as claimed in claim 5, further comprising at least one treatment source associated with the first substrate carrier unit or the second substrate carrier unit, wherein the at least one treatment source is formed as a plasma source having at least one electrode pair.

9. The device as claimed in claim 8, wherein at least one electrode of the at least one electrode pair is arranged in the first sub-chamber and at least one associated back electrode of the at least one electrode pair is arranged in the second sub-chamber, wherein the back electrode can be positioned together with the second sub-chamber relative to the first sub-chamber.

10. The device as claimed in claim 8, wherein the at least one electrode pair comprises at least one electrode in the form of a plate.

11. The device as claimed in claim 1, further comprising at least one treatment source associated with at least one of the first substrate carrier unit and the second substrate carrier unit, wherein the dimensioning of at least one of the evaporator array and the treatment sources comprises an extension of at least one of the evaporator array and the treatment sources beyond the end regions of the substrate carrier units in order to compensate for spatial end effects.

12. The device as claimed in claim 1, wherein a distance of the evaporator elements from one another can be adjusted in order to compensate for a decrease in a coating rate in the end regions of the evaporator array or of the substrate carrier units.

13. A device for the vacuum coating of substrates in a vacuum chamber, comprising:
an elongate evaporator array having a number of metallic evaporator elements extending between carrier rods, wherein the metallic evaporator elements are arranged along a vertical longitudinal axis with respect to one another and are configured to generate a vapor of a coating material;
a plurality of substrate carrier units associated with the evaporator array, comprising:
a first substrate carrier unit having a first cylindrical pylon that can be rotated about a first rotation axis and being configured to retain a first substrate on the curved portion of the first pylon surface, wherein there is an angular offset of less than 10° between the longitudinal axis and the first rotation axis; and
a second substrate carrier unit having a second cylindrical pylon that can be rotated about a second rotation axis and being configured to retain a second substrate on the curved portion of the second pylon surface, wherein there is an angular offset of less than 10° between the longitudinal axis and the second rotation axis,
wherein, when the first substrate carrier unit rotates about the first rotation axis and the second substrate carrier unit rotates about the second rotation axis, the axes of the pylons are stationary relative to the longitudinal axis of the evaporator array and the evaporator array generates the vapor of the coating material,
wherein the evaporator array does not rotate about its longitudinal axis, the first substrate carrier unit and the second substrate carrier unit do not rotate about the evaporator array,
wherein a first substrate retained by the first substrate carrier unit rotates in an off-center position to the first rotation axis and a second substrate retained by the second substrate carrier unit rotates in an off-center position to the second rotation axis, and
wherein each of the plurality of substrate carrier units is arranged at geometrically equivalent positions relative to the evaporator array that take into account the spatial emissions characteristics of the individual metallic evaporator elements and of the evaporator array as a whole such that coating can be carried out by the evaporator array on substrates with equal quality;
wherein the spatial emission characteristic of a metallic evaporator element is an angular dependence of a flow density of evaporated material of that metallic evaporator element, and wherein the angle between the evaporator array and each substrate carrier unit is equivalent.

14. A method for the vacuum coating of substrates, characterized in that the vacuum coating is carried out by means of a device as claimed in one of the preceding claims.

15. The method as claimed in claim 14, characterized in that thermal evaporation of a metallic material, in particular consisting of at least one of the members of the group consisting of aluminum, copper, tin, chromium, titanium, tantalum, gold, silver, rhodium, palladium and nickel, is carried out by means of the evaporator array (10, 110, 110a).

16. The method as claimed in one of claims 14 and 15, characterized in that treatment of the substrates with the aid of a glow discharge process is carried out by means of at least one of the treatment sources (31, 32).

17. The method as claimed in one of claims 14 to 16, characterized in that treatment of the substrates with the aid of a plasma CVD process is carried out by means of at least one of the treatment sources (31, 32).

* * * * *